(12) United States Patent
Yan

(10) Patent No.: US 11,782,547 B2
(45) Date of Patent: Oct. 10, 2023

(54) DISPLAY SUBSTRATE AND MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Jun Yan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/996,986

(22) PCT Filed: Oct. 22, 2021

(86) PCT No.: PCT/CN2021/125515
§ 371 (c)(1),
(2) Date: Oct. 24, 2022

(87) PCT Pub. No.: WO2022/188413
PCT Pub. Date: Sep. 15, 2022

(65) Prior Publication Data
US 2023/0161428 A1    May 25, 2023

(30) Foreign Application Priority Data

Mar. 11, 2021 (CN) .......................... 202110265127.6

(51) Int. Cl.
*G06F 3/041* (2006.01)
*H10K 59/131* (2023.01)
(Continued)

(52) U.S. Cl.
CPC ....... *G06F 3/0412* (2013.01); *H10K 59/1201* (2023.02); *H10K 59/122* (2023.02);
(Continued)

(58) Field of Classification Search
CPC .. G06F 3/0412; G06F 3/04164; G06F 3/0443; G06F 3/0445; G06F 3/0446;
(Continued)

(56) References Cited

U.S. PATENT DOCUMENTS 10,963,111 B1    3/2021  Xiao et al.
11,537,256 B2 *  12/2022 He ......................... G06F 3/0443
(Continued)

FOREIGN PATENT DOCUMENTS

CN    107092400 A    8/2017
CN    109976056 A    7/2019
(Continued)

*Primary Examiner* — Joe H Cheng
(74) *Attorney, Agent, or Firm* — DINSMORE & SHOHL LLP

(57) ABSTRACT

The present disclosure provides a display substrate and a manufacturing method therefor, and a display device. The display substrate includes: a substrate base, including a first region and a second region; a plurality of sub-pixels, at least one sub-pixel including a light-emitting element including a first electrode, a light-emitting layer, and a second electrode; a plurality of first power lines electrically connected to the first electrode; a first power bus electrically connected to the plurality of first power lines; a second power line electrically connected to the second electrode and including a first portion and a second portion, a gap existing between the second portion of the second power line and the first power bus; a first insulating layer covering the first power bus, the second power line, and the gap; a conductive layer on the first insulating layer; and a plurality of touch electrode lines.

18 Claims, 6 Drawing Sheets

(51) Int. Cl.
*H10K 59/12* (2023.01)
*H10K 59/40* (2023.01)
*H10K 59/122* (2023.01)
*H10K 59/80* (2023.01)
*H10K 59/124* (2023.01)
*H10K 77/10* (2023.01)

(52) U.S. Cl.
CPC ......... *H10K 59/124* (2023.02); *H10K 59/131* (2023.02); *H10K 59/40* (2023.02); *H10K 59/873* (2023.02); *H10K 77/111* (2023.02); *G06F 2203/04102* (2013.01); *G06F 2203/04103* (2013.01)

(58) Field of Classification Search
CPC G06F 2203/04102; G06F 2203/04103; H10K 59/1201; H10K 59/122; H10K 59/124; H10K 59/131; H10K 59/40; H10K 59/873; H10K 77/111
See application file for complete search history.

(56) References Cited

U.S. PATENT DOCUMENTS

| | | | |
|---|---|---|---|
| 11,609,656 | B2* | 3/2023 | He ........................ H10K 50/805 |
| 11,703,978 | B2* | 7/2023 | Yan ..................... G06F 3/04164 |
| | | | 345/174 |
| 2021/0399079 | A1 | 12/2021 | Yan et al. |

FOREIGN PATENT DOCUMENTS

| | | |
|---|---|---|
| CN | 110690365 A | 1/2020 |
| CN | 110851016 A | 2/2020 |
| CN | 112905055 A | 6/2021 |

* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Stage Application under 35 U.S.C. § 371 of International Patent Application No. PCT/CN2021/125515, filed on Oct. 22, 2021, which claims priority to China Patent Application No. 202110265127.6 filed on Mar. 11, 2021, the disclosure of both of which are incorporated by reference herein in entirety.

TECHNICAL FIELD

The present disclosure relates to a display substrate and a manufacturing method therefor, and a display device.

BACKGROUND

With the rapid development of AMOLED (Active Matrix Organic Light Emitting Diode), the development of a smart terminal such as a mobile phone has entered the era of full screen and narrow bezel design. In order to bring a better user experience to a user, features such as full screen, narrow bezel, high resolution, wearable and/or foldable devices will be an important development direction of AMOLED in the future.

In the related art, in order to make display panels lighter and thinner to accommodate future foldable and rollable products, touch technology has been developed. For example, the touch technology may be FMLOC (Flexible Multi Layer On Cell) technology. In FMLOC technology, a touch electrode is fabricated on an encapsulation layer.

SUMMARY

According to an aspect of an embodiment of the present disclosure, a display substrate is provided. The display substrate comprises: a base substrate comprising a first region and a second region surrounding the first region, wherein the first region comprises a first boundary, a second boundary, a third boundary and a fourth boundary; a plurality of sub-pixels in the first region, at least one of the plurality of sub-pixels comprising a light-emitting element, wherein the light-emitting element comprises a first electrode on the base substrate, a light-emitting layer on a side of the first electrode away from the base substrate, and a second electrode on a side of the light-emitting layer away from the base substrate; a plurality of first power lines located in the first region and electrically connected to the first electrode of the at least one of the plurality of sub-pixels; a first power bus in the second region on a side of the first boundary away from the first region, the first power bus being electrically connected to the plurality of first power lines; a second power line located in the second region and electrically connected to the second electrode, the second power line comprising a first portion and a second portion, wherein the first portion surrounds the second boundary, the third boundary and the fourth boundary of the first region, the second portion is on aside of the first power bus away from the first region, wherein a gap is provided between the second portion of the second power line and the first power bus; a first insulating layer covering the first power bus, the second power line and the gap; a conductive layer on a side of the first insulating layer away from the gap, the conductive layer being configured to receive a fixed signal, and an orthographic projection of the conductive layer on the base substrate at least partially overlapping with an orthographic projection of the gap on the base substrate; and a plurality of touch electrode lines in the second region, wherein each of the plurality of touch electrode lines comprises a first wire on the first insulating layer and a second wire on a side of the first wire away from the base substrate, the first wire being spaced apart from the second wire by a second insulating layer, and the first wire being electrically connected to the second wire through a conductive via hole passing through the second insulating layer, wherein the first wire is in a same layer as the conductive layer and is isolated from the conductive layer, and an orthographic projection of the second wire on the base substrate at least partially overlaps with the orthographic projection of the conductive layer on the base substrate.

In some embodiments, a material of the conductive layer is the same as a material of the first wire.

In some embodiments, the plurality of touch electrode lines comprise a plurality of first touch electrode lines and a plurality of second touch electrode lines, the plurality of first touch electrode lines surrounding the second boundary, the third boundary and a portion of the first boundary, the plurality of second touch electrode lines surrounding the fourth boundary and another portion of the first boundary.

In some embodiments, each of the plurality of first touch electrode lines is a transmitting signal line, and each of the plurality of second touch electrode lines is a receiving signal line.

In some embodiments, the display substrate further comprises: a first touch electrode block and a second touch electrode block in the first region, wherein the first touch electrode block is electrically connected to a first touch electrode line, and the second touch electrode block is electrically connected to a second touch electrode line, wherein the first touch electrode block and the second touch electrode block are in a same layer as the second wire, or the first touch electrode block and the second touch electrode block are in a same layer as the first wire.

In some embodiments, the display substrate further comprises a flexible circuit board electrically connected to the conductive layer, the flexible circuit board being configured to provide the fixed signal to the conductive layer.

In some embodiments, the fixed signal is a ground signal.

In some embodiments, the orthographic projection of the gap on the base substrate is inside the orthographic projection of the conductive layer on the base substrate.

In some embodiments, a width of the gap extending in a direction perpendicular to the first boundary ranges from 40 microns to 60 microns; and a width of the conductive layer extending in the direction perpendicular to the first boundary ranges from 50 microns to 70 microns.

In some embodiments, the display substrate further comprises a bending region between the conductive layer and the flexible circuit board, wherein the conductive layer is connected to the flexible circuit board via a fixed signal line passing through the bending region.

In some embodiments, the conductive layer is in a same layer as the fixed signal line, and a material of the conductive layer is the same as a material of the fixed signal line.

In some embodiments, the second portion comprises a first sub-portion and a second sub-portion, wherein the first sub-portion is spaced apart from and disposed opposite to the second sub-portion, the first sub-portion being close to the second boundary, and the second sub-portion being close to the fourth boundary; and a first gap is provided between the first sub-portion and the first power bus, and a second gap is provided between the second sub-portion and the first power bus, wherein an orthographic projection of at least one of the first gap or the second gap on the base substrate at least partially overlaps with the orthographic projection of the conductive layer on the base substrate.

In some embodiments, the first power bus is configured to receive a first voltage signal; and the second power line is configured to receive a second voltage signal; wherein the first voltage signal is greater than the second voltage signal.

In some embodiments, the first insulating layer comprises: a planarization layer covering the first power bus and the second power line; a pixel defining layer on the planarization layer; an encapsulation layer on a side of the pixel defining layer away from the planarization layer; and a barrier layer on a side of the encapsulation layer away from the pixel defining layer.

In some embodiments, the display substrate further comprises a third insulating layer covering the base substrate, wherein the first power bus and the second power line are on a side of the third insulating layer away from the base substrate.

In some embodiments, the display substrate further comprises: a plurality of first signal lines and a plurality of second signal lines embedded in the third insulating layer, wherein orthographic projections of the plurality of first signal lines on the base substrate are alternately arranged with orthographic projections of the plurality of second signal lines on the base substrate.

According to another aspect of an embodiment of the present disclosure, a display device is provided. The display device comprises the display substrate described above.

According to another aspect of an embodiment of the present disclosure, a manufacturing method for a display substrate is provided. The manufacturing method comprises: providing a base substrate, the base substrate comprising a first region and a second region surrounding the first region, wherein the first region comprises a first boundary, a second boundary, a third boundary and a fourth boundary; forming a plurality of sub-pixels in the first region, at least one of the plurality of sub-pixels comprising a light-emitting element, wherein the light-emitting element comprises a first electrode on the base substrate, a light-emitting layer on a side of the first electrode away from the base substrate, and a second electrode on a side of the light-emitting layer away from the base substrate; forming a plurality of first power lines located in the first region and electrically connected to the first electrode of the at least one of the plurality of sub-pixels; forming a first power bus in the second region on a side of the first boundary away from the first region, the first power bus being electrically connected to the plurality of first power lines; forming a second power line located in the second region and electrically connected to the second electrode, the second power line comprising a first portion and a second portion, wherein the first portion surrounds the second boundary, the third boundary and the fourth boundary of the first region, the second portion is on a side of the first power bus away from the first region, wherein a gap is provided between the second portion of the second power line and the first power bus; forming a first insulating layer covering the first power bus, the second power line and the gap; forming a conductive layer on a side of the first insulating layer away from the gap, the conductive layer being configured to receive a fixed signal, and an orthographic projection of the conductive layer on the base substrate at least partially overlapping with an orthographic projection of the gap on the base substrate; and forming a plurality of touch electrode lines in the second region, wherein each of the plurality of touch electrode lines comprises a first wire on the first insulating layer and a second wire on a side of the first wire away from the base substrate, the first wire being spaced apart from the second wire by a second insulating layer, and the first wire being electrically connected to the second wire through a conductive via hole passing through the second insulating layer, wherein the first wire is in a same layer as the conductive layer and is isolated from the conductive layer, the first wire and the conductive layer are formed by a same patterning process, and an orthographic projection of the second wire on the base substrate at least partially overlaps with the orthographic projection of the conductive layer on the base substrate.

Other features and advantages of the present disclosure will become apparent from the following detailed description of exemplary embodiments of the present disclosure in conjunction with the accompanying drawings.

BRIEF DESCRIPTION OF THE DRAWINGS

The accompanying drawings which constitute part of this specification, illustrate the exemplary embodiments of the present disclosure, and together with this specification, serve to explain the principles of the present disclosure.

The present disclosure may be more explicitly understood from the following detailed description with reference to the accompanying drawings, in which.

Figure 1:
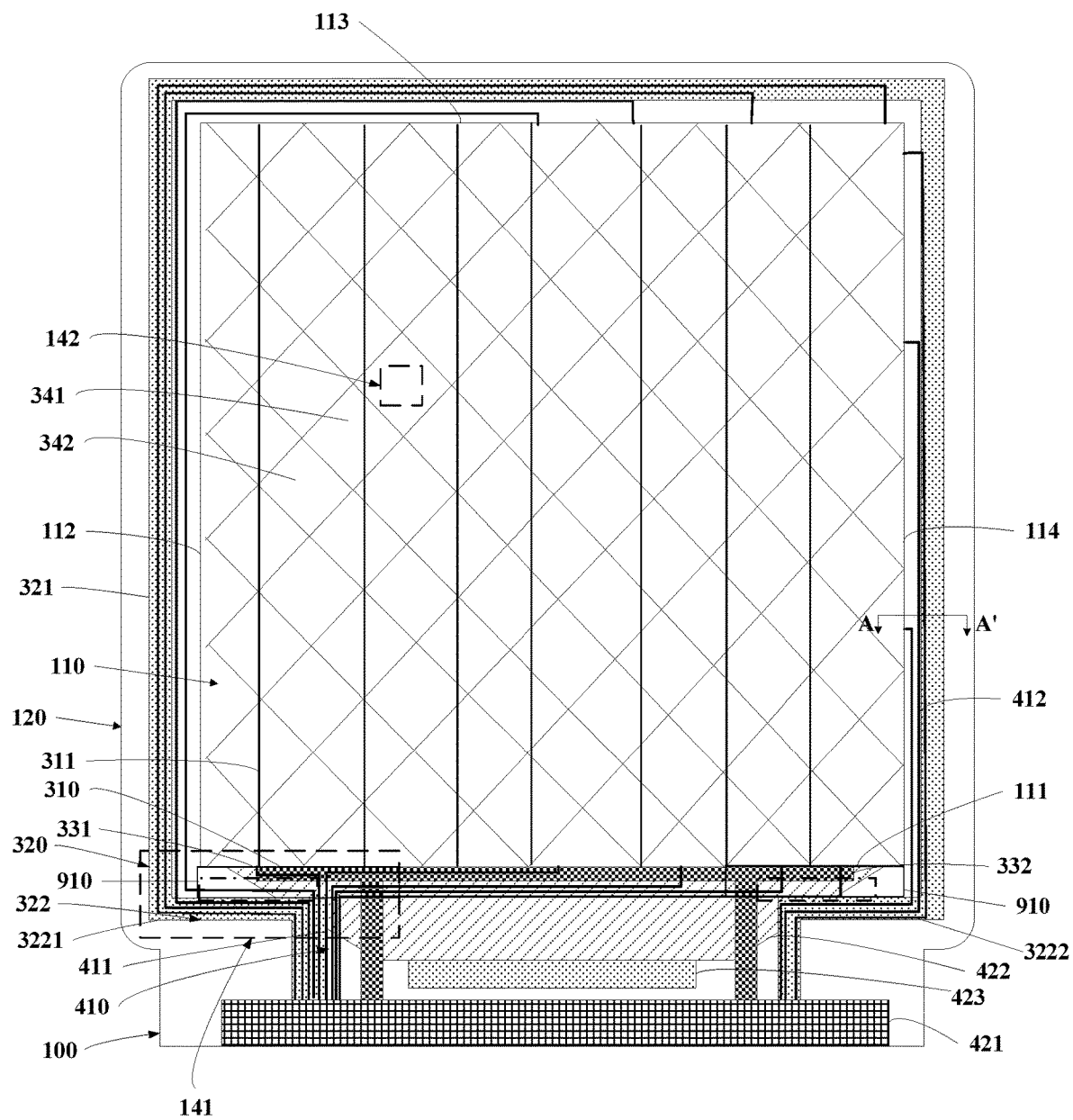
FIG. 1 is a top view illustrating a display substrate according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

At a corner region of a display substrate in the related art, there is a gap between a power supply voltage line and a common connection line. A part of a touch electrode line is above the gap, and there is another signal line (such as a data line and/or a GOA (Gate Driver on Array, i.e., gate driver circuit) signal line) under the gap. Therefore, signal interference may occur between the touch electrode line and the data line or GOA signal line, resulting in poor display or poor touch performance.

In view of this, some embodiments of the present disclosure provide a display substrate to reduce signal interference. A structure of a display substrate according to an embodiment of the present disclosure will be described in detail below with reference to the accompanying drawings.

Figure 4:
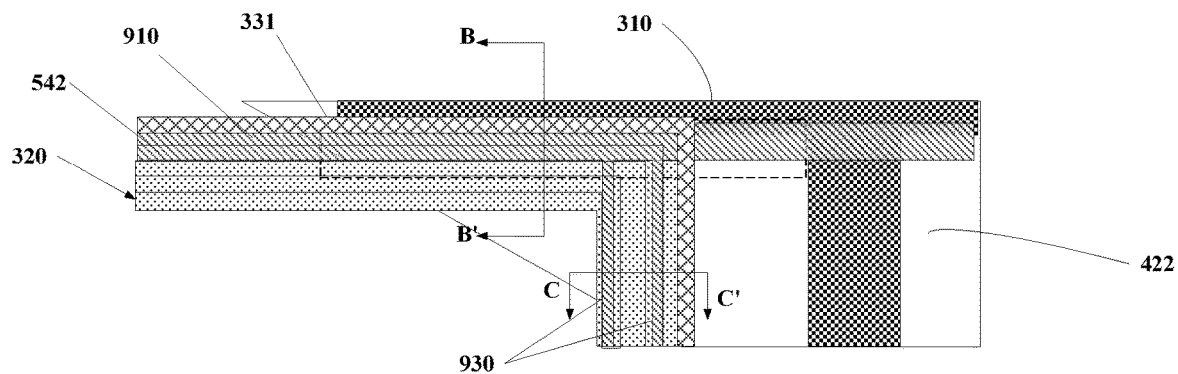
FIG. 4 is an enlarged schematic diagram illustrating a partial structure of the display substrate within the first dotted box 141 shown in FIG. 1 according to an embodiment of the present disclosure.
Figure 5:
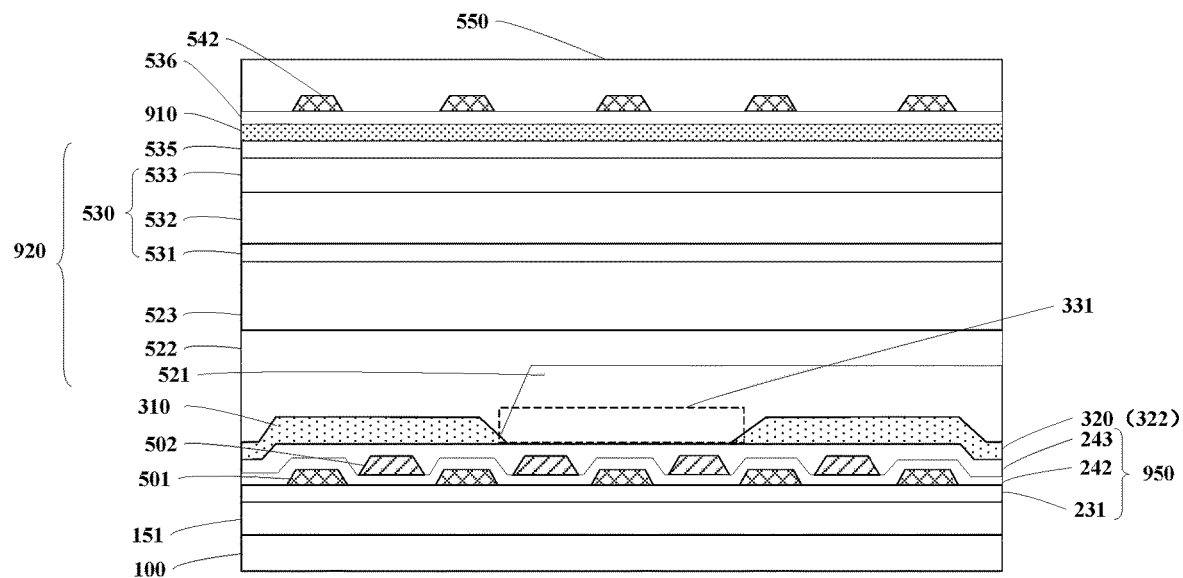
FIG. 5 is a schematic cross-sectional view showing a structure taken along line B-B' in FIG. 4.
Figure 8:
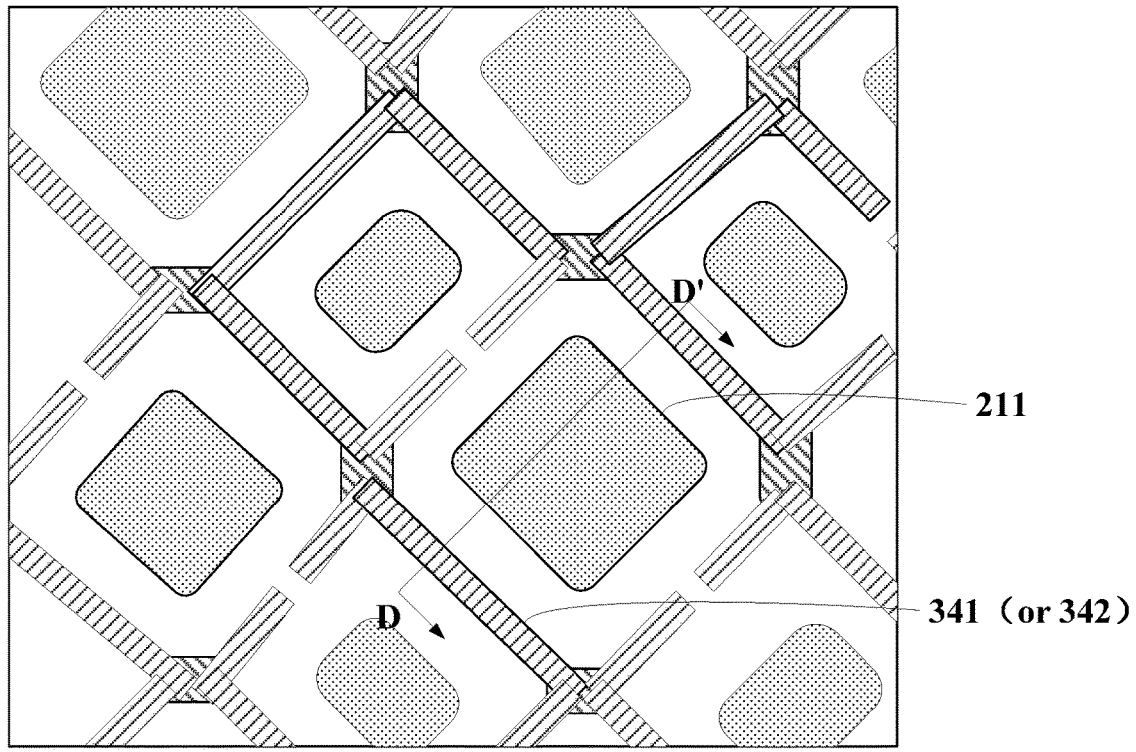
FIG. 8 is an enlarged schematic diagram showing a partial structure within a second dotted box 142 in FIG. 1.
Figure 9:
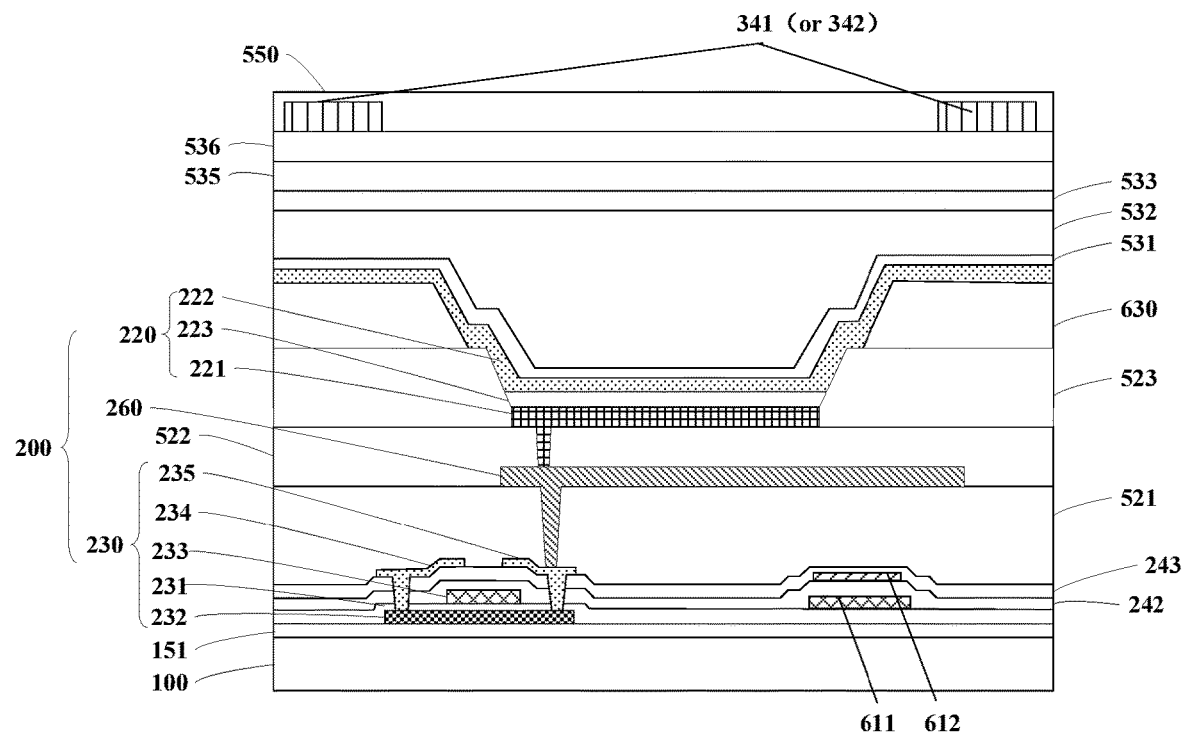
FIG. 9 is a schematic cross-sectional view showing a structure taken along line D-D' in FIG. 8.

FIG. 1 is a top view illustrating a display substrate according to an embodiment of the present disclosure. FIG. 4 is an enlarged schematic diagram illustrating a partial structure of the display substrate within a first dotted box 141 shown in FIG. 1 according to an embodiment of the present disclosure. FIG. 5 is a schematic cross-sectional view showing a structure taken along line B-B' in FIG. 4. FIG. 8 is an enlarged schematic diagram showing a partial structure within a second dotted box 142 in FIG. 1. FIG. 9 is a schematic cross-sectional view showing a structure taken along line D-D' in FIG. 8.

As shown in FIGS. 1, 8 and 9, the display substrate comprises a base substrate 100, a plurality of sub-pixels 200, a plurality of first power lines 311, a first power bus 310 and a second power line 320.

The base substrate 100 comprises a first region 110 and a second region 120 surrounding the first region 110. For example, the first region 110 is used to form a display region, and the second region 120 is a peripheral region. The first region 110 comprises a first boundary 111, a second boundary 112, a third boundary 113, and a fourth boundary 114. Here, the first boundary 111 is opposite to the third boundary 113, and the second boundary 112 is opposite to the fourth boundary 114.

The plurality of sub-pixels 200 are in the first region 110. At least one of the plurality of sub-pixels 200 comprises a light-emitting element 220, as shown in FIG. 9. The light-emitting element 220 comprises a first electrode 221 on the base substrate 100, a light-emitting layer 223 on a side of the first electrode 221 away from the base substrate 100, and a second electrode 222 on a side of the light-emitting layer 223 away from the base substrate 100. For example, the first electrode 221 is an anode, and the second electrode 222 is a cathode. For example, the second electrode 222 can receive a common connection line voltage signal VSS.

It should be noted that, in the embodiments of the present disclosure, when it is described that one structure is on another structure, the one structure may be in direct contact with the another structure, or may not be indirect contact with the another structure. For example, when it is described that the first electrode 221 is on the base substrate 100, the first electrode 221 may be above the base substrate 100 without being in direct contact with the base substrate.

As shown in FIG. 1, a plurality of first power lines 311 are in the first region 110. The plurality of first power lines 311 are electrically connected to the first electrode 221 of the at least one of the plurality of sub-pixels. For example, the plurality of first power lines 311 are electrically connected to the first electrodes 221 of the plurality of sub-pixels. It should be noted that when it is described that one component is electrically connected to another component, the one component may be directly or indirectly electrically connected to the another component. For example, the first power line 311 may be electrically connected to the first electrode 221 of a sub-pixel through several thin film transistors.

As shown in FIG. 1, the first power bus 310 is in the second region 120 on a side of the first boundary 111 away from the first region 110. The first power bus 310 is closer to the first boundary 111 than to other boundaries of the first region. The first power bus 310 is electrically connected to the plurality of first power lines 311.

The second power line 320 is in the second region 120 and is electrically connected to the second electrode 222. The second power line 320 comprises a first portion 321 and a second portion 322. The first portion 321 surrounds the second boundary 112, the third boundary 113 and the fourth boundary 114 of the first region 110. The second portion 322 is on a side of the first power bus 310 away from the first region 110.

In some embodiments, the first power bus 310 is configured to receive a first voltage signal, and the second power line 320 is configured to receive a second voltage signal. The first voltage signal is greater than the second voltage signal. For example, the first voltage signal is a power supply voltage signal VDD, and the second voltage signal is the common connection line voltage signal VSS.

A gap 331 or 332 is provide between the second portion 322 of the second power line 320 and the first power bus 310.

As shown in FIGS. 1, 4 and 5, the display substrate further comprises a first insulating layer 920 covering the first power bus 310, the second power line 320 and the gap 331 (or 332).

As shown in FIGS. 1, 4 and 5, the display substrate further comprises a conductive layer 910 on a side of the first insulating layer 920 away from the gap 331 (or 332). The conductive layer 910 is configured to receive a fixed signal. In some embodiments, the fixed signal is a ground signal. For example, the ground signal is a voltage signal with 0V. Of course, those skilled in the art can understand that the fixed signal may also be a fixed signal with other voltage values, and is not limited to a ground signal with 0V. An orthographic projection of the conductive layer 910 on the base substrate 100 at least partially overlaps with an orthographic projection of the gap 331 (or 332) on the base substrate 100. For example, the orthographic projection of the gap 331 (or 332) on the base substrate 100 is inside the orthographic projection of the conductive layer 910 on the base substrate 100. For example, a material of the conductive layer 910 comprises metal or alloy materials such as titanium and/or aluminum.

As shown in FIG. 1, the display substrate further comprises a plurality of touch electrode lines 410 in the second region 120. The plurality of touch electrode lines 410 comprise a plurality of first touch electrode lines 411 and a plurality of second touch electrode lines 412. The first touch electrode line 411 surrounds the second boundary 112, the third boundary 113 and a portion of the first boundary 111 of the first region 110. The second touch electrode line 412 surrounds the fourth boundary 114 and another part of the first boundary 111 of the first region 110. For example, the first touch electrode line 411 is a transmitting signal line, and the second touch electrode line 412 is a receiving signal line; or the first touch electrode line 411 is a receiving signal line, and the second touch electrode line 412 is a transmitting signal line.

Figure 10:
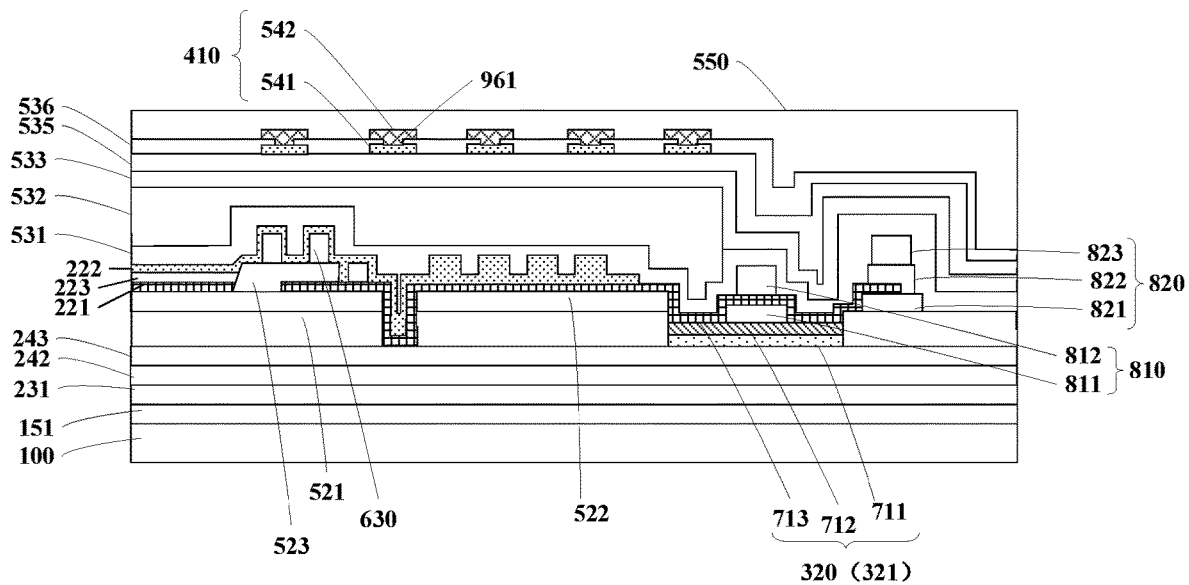
FIG. 10 is a schematic cross-sectional view showing a structure taken along line A-A' in FIG. 1.

In some embodiments, the touch electrode line 410 comprises a first wire 541 (see FIG. 10 later) on the first insulating layer and a second wire 542 (e.g., as shown in FIGS. 4 and 10) on a side of the first wire away from the base substrate 100. The first wire 541 is spaced apart from the second wire 542 by a second insulating layer 536 (e.g., as shown in FIG. 10), and the first wire 541 is electrically connected to the second wire 542 through a conductive via hole (which can be referred to as a first conductive via hole) passing through the second insulating layer 536. The first wire 541 is in a same layer as the conductive layer 910 and is isolated from the conductive layer 910. An orthographic projection of the second wire 542 on the base substrate 100 at least partially overlaps with the orthographic projection of the conductive layer 910 on the base substrate 100. For example, the first wire 541 comprises a Ti/Al/Ti (titanium/aluminum/titanium) three-layer structure, and the second wire 542 comprises a Ti/Al/Ti (titanium/aluminum/titanium) three-layer structure. In some embodiments, a material of the conductive layer 910 is the same as a material of the first wire 541.

It should be noted that "the same layer" refers to a layer structure that is formed by forming a film layer of specific patterns in the same film formation process and then patterned by applying the same mask plate in a single patterning process. Two structural layers in the same layer can be located on the same structural layer. Two structural layers in the same layer may be at different heights or have different thicknesses.

Heretofore, a display substrate according to some embodiments of the present disclosure is provided. In the display substrate, the base substrate comprises a first region and a second region surrounding the first region. A plurality of sub-pixels are in the first region, and each sub-pixel comprises a light-emitting element comprising a first electrode, a light-emitting layer and a second electrode. A plurality of first power lines are electrically connected to the first electrodes of the plurality of sub-pixels. A first power bus is electrically connected to the plurality of first power lines. A second power line is electrically connected to the second electrode. The second power line comprise a first portion and a second portion. The first portion surrounds a second boundary, a third boundary and a fourth boundary of the first region. The second portion is located on a side of the first power bus away from the first region. There is a gap between the second portion of the second power line and the first power bus. A first insulating layer covers the first power bus, the second power line and the gap. A conductive layer is on a side of the first insulating layer away from the gap. The conductive layer is configured to receive a fixed signal. An orthographic projection of the conductive layer on the base substrate at least partially overlaps with an orthographic projection of the gap on the base substrate. A plurality of touch electrode lines are in the second region. The touch electrode line comprises a first wire on the first insulating layer and a second wire on a side of the first wire away from the base substrate. The first wire is spaced apart from the second wire by a second insulating layer, and the first wire is electrically connected to the second wire through a conductive via hole passing through the second insulating layer. The first wire is in the same layer as the conductive layer and is isolated from the conductive layer. An orthographic projection of the second wire on the base substrate at least partially overlaps with the orthographic projection of the conductive layer on the base substrate. In the embodiment, the conductive layer can play a signal shielding function, which can reduce signal interference between signal lines above and below the gap, thereby improving the display effect of the display substrate.

In some embodiments, since the conductive layer is in a same layer as the first wire and a material of the conductive layer is the same as a material of the first wire, the conductive layer can be formed simultaneously when the first wire is formed by a same patterning process, which can facilitate the manufacture of the display substrate.

In addition, the conductive layer provided in the same layer as the first wire can not only reduce interference between different signal lines, but also solve the problem of a reduced width of the first power bus (i.e., the VDD line) caused by bezel narrowing, which is conducive to the narrow bezel design.

In other embodiments, the conductive layer may not be in a same layer as the first wire nor in a same layer as the second wire. For example, the conductive layer may be located below the first wire and isolated from the first wire by an insulating layer. In this case, an orthographic projection of at least one of the first wire or the second wire on the base substrate at least partially overlaps with the orthographic projection of the conductive layer on the base substrate.

In other embodiments, the conductive layer may comprise at least a portion, wherein an orthographic projection of the at least portion on the base substrate does not overlap with orthographic projections of the first and second wires on the base substrate. Here, the at least portion of the conductive layer may be in a same layer as at least one of the first wire or the second wire. That is, the at least portion of the conductive layer may be in a same layer as the first wire; or the at least portion of the conductive layer may be in a same layer as the second wire; or the at least portion of the conductive layer may comprise a first sub-portion in a same layer as the first wire and a second sub-portion in a same layer as the second wire, the first sub-portion being spaced apart from the second sub-portion by a second insulating layer, and the first sub-portion being electrically connected to the second sub-portion through a conductive via hole passing through the second insulating layer.

In some embodiments, as shown in FIG. 1, the second portion 322 of the second power line 320 comprises a first sub-portion 3221 and a second sub-portion 3222. The first sub-portion 3221 is spaced apart from and disposed opposite to the second sub-portion 3222. For example, the first sub-portion 3221 is close to the second boundary 112, and the second sub-portion 3222 is close to the fourth boundary 114. A first gap 331 is provided between the first sub-portion 3221 and the first power bus 310. A second gap 332 is provided between the second sub-portion 3222 and the first power bus 310. An orthographic projection of at least one of the first gap 331 or the second gap 332 on the base substrate 100 at least partially overlaps with the orthographic projection of the conductive layer 910 on the base substrate 100.

In some embodiments, orthographic projections of the first gap 331 and the second gap 332 on the base substrate 100 are inside the orthographic projection of the conductive layer 910 on the base substrate 100. In this way, the conductive layer can completely cover the two gaps, thereby further reducing signal interference between different signal lines and improving the display effect of the display substrate.

In some embodiments, as shown in FIG. 1, the display substrate further comprises a flexible circuit board 421 electrically connected to the conductive layer 910. The flexible circuit board 421 is configured to provide a fixed signal (e.g., a ground signal GND) to the conductive layer 910. Here, in the case where the fixed signal is a ground signal, it is convenient to directly provide the fixed signal to the conductive layer from the flexible circuit board without providing an additional fixed signal source.

As shown in FIG. 1, the flexible circuit board 421 is also electrically connected to the plurality of touch electrode lines 410, the first power bus 310 and the second power line 320. The flexible circuit board 421 is further configured to provide electrical signals to the plurality of touch electrode lines 410, the first power bus 310 and the second power line 320.

In some embodiments, as shown in FIG. 1, the display substrate further comprises a signal connection region 422 and an integrated circuit region 423. The integrated circuit region 423 is electrically connected to the first region 110 through the signal connection region 422. A plurality of data lines are in the signal connection region 422.

In some embodiments, as shown in FIG. 1, the display substrate further comprises a first touch electrode block 341 and a second touch electrode block 342 located in the first region. The first touch electrode block 341 is electrically connected to the first touch electrode line 411, and the second touch electrode block 342 is electrically connected to the second touch electrode line 412. Touch signals of the first touch electrode block 341 and the second touch electrode block 342 are different. In some embodiments, the first touch electrode block 341 and the second touch electrode block 342 are in a same layer as the second wire 542 (as shown in FIGS. 9 and 10). In other embodiments, the first touch electrode block 341 and the second touch electrode block 342 are in a same layer as the first wire 541.

In some embodiments, different first touch electrode blocks 341 are connected through an electrode bridge, and different second touch electrode blocks 342 are directly connected to each other. In other embodiments, different second touch electrode blocks 342 are connected through an electrode bridge, and different first touch electrode blocks 341 are directly connected to each other.

Figure 2:
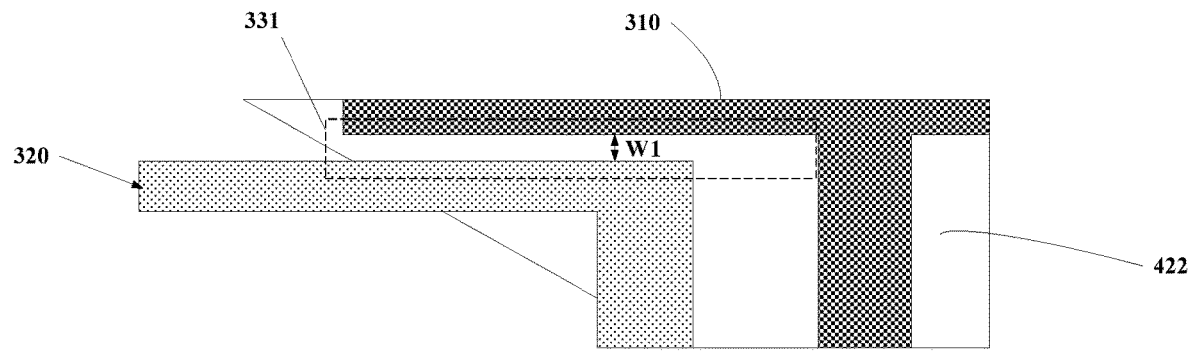
FIG. 2 is an enlarged schematic diagram illustrating a partial structure within a first dotted box 141 shown in FIG. 1, wherein a second wire of a touch electrode line and a conductive layer are omitted from the partial structure.

FIG. 2 is an enlarged schematic diagram illustrating a partial structure within a first dotted box 141 shown in FIG. 1, wherein a second wire of a touch electrode line and a conductive layer are omitted from the partial structure as shown in FIG. 2.

In some embodiments, as shown in FIG. 2, a width W1 of the gap 331 (or 332) extending in a direction perpendicular to the first boundary 111 ranges from 40 microns to 60 microns. For example, the width of the gap may be 50 microns.

Figure 3:
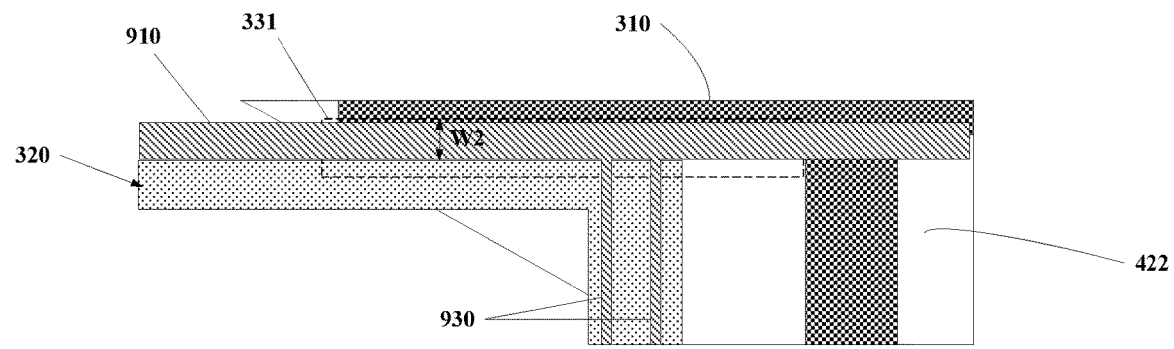
FIG. 3 is an enlarged schematic diagram illustrating a partial structure of the display substrate within the first dotted box 141 shown in FIG. 1 according to an embodiment of the present disclosure, wherein the second wire of the touch electrode line is omitted from the partial structure.

FIG. 3 is an enlarged schematic diagram illustrating a partial structure of the display substrate within the first dotted box 141 shown in FIG. 1 according to an embodiment of the present disclosure, wherein the second wire of the touch electrode line is omitted from the partial structure as shown in FIG. 3.

In some embodiments, as shown in FIG. 3, a width W2 of the conductive layer 910 extending in a direction perpendicular to the first boundary 111 ranges from 50 microns to 70 microns. For example, the width of the conductive layer 910 is 60 microns. For example, the conductive layer may exceed the edge of the gap by several microns (e.g., 5 microns), which can adequately cover the gap and further reduce signal interference between different signal lines. As shown in FIG. 3, the conductive layer 910 is connected to the flexible circuit board 421 (not shown in FIG. 3) via a fixed signal line 930. For example, the fixed signal line is a ground signal line. For example, the conductive layer 910 is in a same layer as the fixed signal line 930, and the material of the conductive layer 910 is the same as a material of the fixed signal line 930. In this way, the conductive layer and the fixed signal line can be formed by a same patterning process, thereby facilitating the manufacture of the display substrate.

The structure taken along line B-B' in FIG. 4 will be described in detail below with reference to FIG. 5.

As shown in FIG. 5, the display substrate comprises the base substrate 100 and a third insulating layer 950 covering the base substrate 100. The first power bus 310 and the second power line 320 are on a side of the third insulating layer 950 away from the base substrate 100. That is, the first power bus 310 and the second power line 320 are on the third insulating layer 950.

In some embodiments, the display substrate further comprises a buffer layer 151 between the base substrate 100 and the third insulating layer 950. In this way, the third insulating layer 950 indirectly covers the base substrate 100. Of course, those skilled in the art can understand that the display substrate may not comprise the buffer layer 151 so that the third insulating layer 950 may directly cover the base substrate 100.

In some embodiments, as shown in FIG. 5, the third insulating layer 950 comprises: a first sub-insulating layer 231 directly or indirectly covering the base substrate 100, a second sub-insulating layer 242 on the first sub-insulating layer 231, and a third sub-insulating layer 243 on the second sub-insulating layer 242. For example, materials of the first sub-insulating layer 231, the second sub-insulating layer 242 and the third sub-insulating layer 243 comprise silicon dioxide, silicon nitride, or the like.

In some embodiments, as shown in FIG. 5, the display substrate further comprises: a plurality of first signal lines 501 and a plurality of second signal lines 502 embedded in the third insulating layer 950. Orthographic projections of the plurality of first signal lines 501 on the base substrate 100 are alternately arranged with orthographic projections of the plurality of second signal lines 502 on the base substrate 100. The plurality of first signal lines 501 and the plurality of second signal lines 502 are disposed in different layers. Arranging the signal lines 501 and 502 in this way can save space. As shown in FIG. 5, the plurality of first signal lines 501 and the plurality of second signal lines 502 are on a side of the first sub-insulating layer 231 away from the base substrate 100. For example, the first signal line 501 and the second signal line 502 are data signal lines.

Since orthographic projections of a portion of the plurality of first signal lines 501 and a portion of the plurality of second signal lines 502 on the base substrate at least partially overlap with the orthographic projection of the gap 331 or 332 on the base substrate, the above conductive layer 910 can reduce signal interference between the signal line 501 or 502 and the touch electrode line.

As shown in FIG. 5, the second sub-insulating layer 242 is between the plurality of first signal lines 501 and the plurality of second signal lines 502. The third sub-insulating layer 243 covers the plurality of second signal lines 502.

As shown in FIG. 5, the first insulating layer 920 covers the first power bus 310, the second power line 320 and the gap 331 (or 332).

In some embodiments, the first insulating layer 920 comprises a planarization layer covering the first power bus 310 and the second power line 320. For example, the planarization layer comprises: a first planarization layer 521 covering at least the second power line 320 and a second planarization layer 522 covering the first power bus 310 and the first planarization layer 521. For example, a material of the first planarization layer 521 and a material of the second planarization layer 522 each comprise an organic insulating material such as polyimide.

In some embodiments, as shown in FIG. 5, the first insulating layer 920 further comprises a pixel defining layer 523 on the planarization layer (e.g., the second planarization layer 522).

In some embodiments, as shown in FIG. 5, the first insulating layer 920 further comprises an encapsulation layer 530 on a side of the pixel defining layer 523 away from the planarization layer (e.g., the second planarization layer 522). For example, the encapsulation layer 530 comprises: a first inorganic encapsulation layer 531 on a side of the pixel defining layer 523 away from the planarization layer, an organic encapsulation layer 532 on a side of the first inorganic encapsulation layer 531 away from the pixel defining layer 523, and a second inorganic encapsulation layer 533 on a side of the organic encapsulation layer 532 away from the first inorganic encapsulation layer 531. For example, a material of the first inorganic encapsulation layer 531 comprises silicon nitride, etc., a material of the organic encapsulation layer 532 comprises PMMA (poly(methyl methacrylate), also known as acrylic), etc., and a material of the second inorganic encapsulation layer 533 comprises silicon nitride, etc.

For example, the first inorganic encapsulation layer 531 can be formed on the pixel defining layer 523 by a CVD (Chemical Vapor Deposition) process, the organic encapsulation layer 532 can be formed on the first inorganic encapsulation layer 531 by an inkjet printing process, and then the second inorganic encapsulation layer 533 can be formed on the organic encapsulation layer 532 by a CVD process.

In some embodiments, as shown in FIG. 5, the first insulating layer 920 further comprises a barrier layer 535 on a side of the encapsulation layer 530 away from the pixel defining layer 523. For example, a material of the barrier layer 535 comprises an inorganic insulating material. For another example, the material of the barrier layer 535 comprises an organic insulating material. As shown in FIG. 5, the conductive layer 910 is on a side of the barrier layer 535 away from the base substrate 100. In fact, the first wire 541 of the touch electrode line 410 is also located on the barrier layer 535 (see FIG. 10 later). This indicates that the conductive layer 910 and the first wire 541 of the touch electrode line 410 are in the same layer.

In some embodiments, as shown in FIG. 5, the display substrate further comprises a second insulating layer 536 covering the conductive layer 910 and the first wire 541. For example, a material of the second insulating layer 536 comprises silicon nitride, silicon oxide, silicon oxynitride, or the like. For another example, the material of the second insulating layer 536 comprises an organic insulating material. As shown in FIG. 5, the second wire 542 of the touch electrode line 410 is on the second insulating layer 536.

In some embodiments, as shown in FIG. 5, the display substrate further comprises a cover layer 550 covering the second wire 542. For example, a material of the cover layer 550 comprises an organic insulating material.

Figure 6:
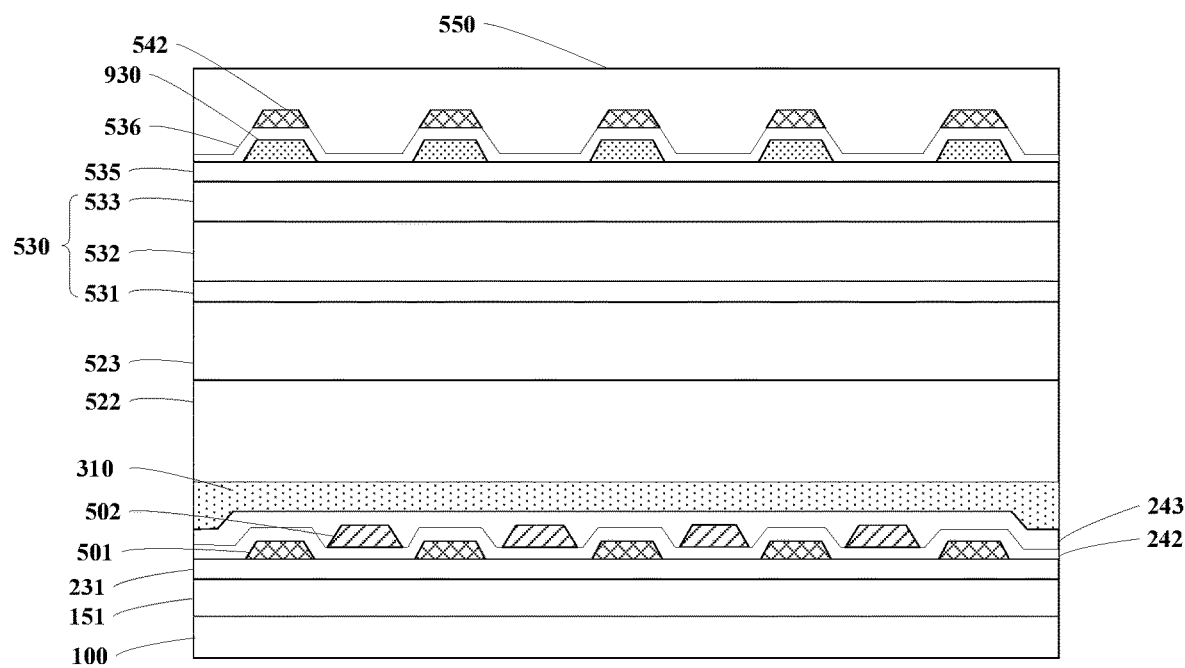
FIG. 6 is a schematic cross-sectional view showing a structure taken along line C-C' in FIG. 4.

FIG. 6 is a schematic cross-sectional view showing a structure taken along line C-C' in FIG. 4.

Here, some structural layers in FIG. 6 that are similar to those shown in FIG. 5 will not be repeated. As shown in FIG. 6, the fixed signal line 930 is on the barrier layer 535. The fixed signal line 930 is spaced apart from the second wire 542 by the second insulating layer 536. The fixed signal line 930 is in a same layer as the conductive layer 910 and is connected to the conductive layer 910. In this way, it is convenient to form the fixed signal line and the conductive layer through a same patterning process, thereby facilitating the manufacture of the display substrate.

Figure 7:
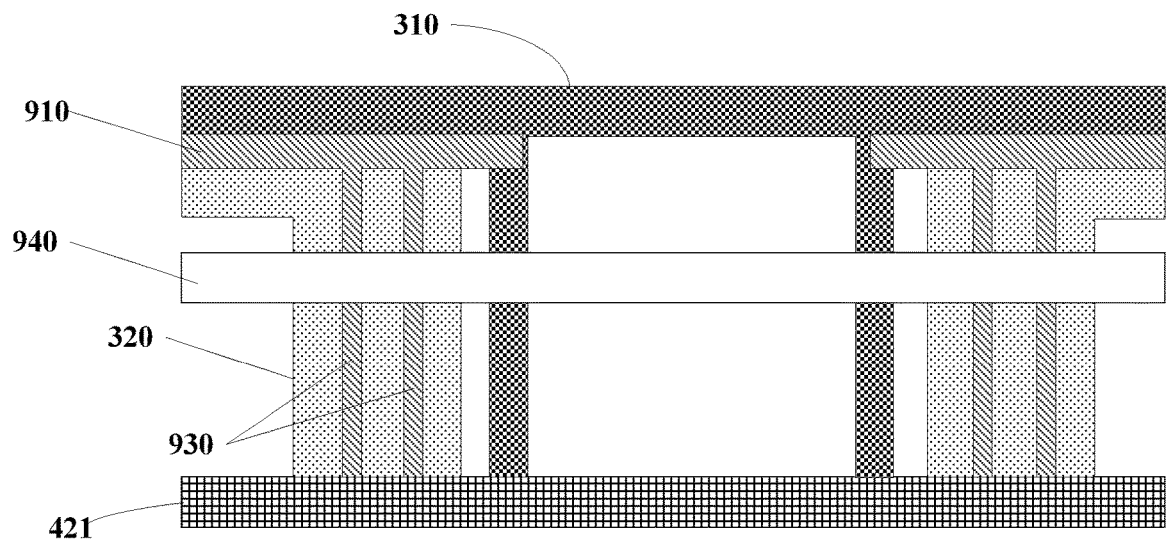
FIG. 7 is a top view illustrating a partial structure of a display substrate according to another embodiment of the present disclosure.

FIG. 7 is a top view illustrating a partial structure of a display substrate according to another embodiment of the present disclosure. Here, some structures in FIG. 7 that are similar to those shown in FIG. 1 will not be repeated.

In some embodiments, as shown in FIG. 7, the display substrate further comprises a bending region 940. The bending region 940 is between the conductive layer 910 and the flexible circuit board 421. The conductive layer 910 is connected to the flexible circuit board 421 via the fixed signal line 930, the fixed signal line 930 passing through the bending region 940.

FIG. 8 is an enlarged schematic diagram showing a partial structure within a second dotted box 142 in FIG. 1.

FIG. 8 shows a first touch electrode block 341 (or a second touch electrode block 342). As described above, the first touch electrode block 341 is electrically connected to the first touch electrode line 411, and the second touch electrode block 342 is electrically connected to the second touch electrode line 412. In addition, FIG. 8 also shows an opening 211 of a sub-pixel.

FIG. 9 is a schematic cross-sectional view showing a structure taken along line D-D' in FIG. 8.

As shown in FIG. 9, in addition to the light-emitting element 220, the sub-pixel 200 further comprises a thin film transistor 230 and a connection electrode 260.

The thin film transistor 230 comprises an active layer 232 on the base substrate 100, a gate electrode 233 on aside of the active layer 232 away from the base substrate 100, and a source electrode 234 and a drain electrode 235 on a side of the gate electrode 233 away from the base substrate 100. For example, the active layer 232 may be on the buffer layer 151. The first sub-insulating layer 231 is between the active layer 232 and the gate electrode 233. The second sub-insulating layer 242 and the third sub-insulating layer 243 are between the gate electrode 233 and the source electrode 234/drain electrode 235. The source electrode 234 is electrically connected to the active layer 232 through a second conductive via hole. The second conductive via hole passes through the third sub-insulating layer 243, the second sub-insulating layer 242 and the first sub-insulating layer 231. The drain electrode 235 is electrically connected to the active layer 232 through a third conductive via hole. The third conductive via hole passes through the third sub-insulating layer 243, the second sub-insulating layer 242 and the first sub-insulating layer 231.

As shown in FIG. 9, the connection electrode 260 is on a side of the thin film transistor 230 away from the base substrate 100. The source electrode 234 or the drain electrode 235 is electrically connected to the connection electrode 260. The connection electrode 260 is electrically connected to the first electrode 221 of the light-emitting element 220. For example, the connection electrode 260 is electrically connected to the drain electrode 235 through a fourth conductive via hole. The fourth conductive via hole passes through the first planarization layer 521. The first electrode 221 is electrically connected to the connection electrode 260 through a fifth conductive via hole. The fifth conductive via hole passes through the second planarization layer 522.

In other embodiments, the display substrate may not be provided with the connection electrodes 260. In this way, the first planarization layer 521 and the second planarization layer 522 are the same planarization layer. The first electrode 221 is electrically connected to the drain electrode 235 through a conductive via hole passing through the planarization layer.

In some embodiments, as shown in FIG. 9, the display substrate further comprises a capacitor between the third sub-insulating layer 243 and the base substrate 100. The capacitor comprises a first capacitor electrode 611 on a side of the first sub-insulating layer 231 away from the base substrate 100 and a second capacitor electrode 612 on a side of the second sub-insulating layer 242 away from the first capacitor electrode 611. The first capacitor electrode 611 is in a same layer as the gate electrode 233 and is isolated from the gate electrode 233. The second capacitor electrode 612 is in a same layer as the second signal line 502, and the second capacitor electrode 612 and the second signal line are formed by a same patterning process. The second sub-insulating layer 242 covers the first capacitor electrode 611, and the third sub-insulating layer 243 covers the second capacitor electrode 612.

It should be noted that the "same patterning process" described above refers to forming a film layer of specific patterns in the same film forming process and then forming a layer structure by applying the same mask plate in a single patterning process. It should be noted that, depending on different particular patterns, the single patterning process may comprise multiple exposure, development or etching processes, and the particular patterns in the formed layer structure may be continuous or discontinuous. These particular patterns may also be at different heights or have different thicknesses.

In some embodiments, as shown in FIG. 9, the display substrate further comprises a spacer layer 630 on a side of the pixel defining layer 523 away from the base substrate 100. The second electrode 222 of the light emitting element 220 covers the spacer layer 630. For example, a material of the spacer layer 630 comprises an inorganic insulating material or an organic insulating material.

In some embodiments, as shown in FIG. 9, the first touch electrode block 341 and the second touch electrode block 342 are on aside of the second insulating layer 536 away from the base substrate 100. The cover layer 550 covers the first touch electrode block 341 and the second touch electrode block 342.

In other embodiments, the display substrate may further comprise a passivation layer (not shown in FIG. 9) between the third sub-insulating layer 243 and the first planarization layer 521.

FIG. 10 is a schematic cross-sectional view showing a structure taken along line A-A' in FIG. 1.

In some embodiments, as shown in FIG. 10, a first portion 321 of the second power line 320 comprises a first conductive portion 711, a second conductive portion 712 and a third conductive portion 713. The second conductive portion 712 is on a side of the first conductive portion 711 away from the base substrate 100. The third conductive portion 713 is on a side of the second conductive portion 712 away from the base substrate 100. The first conductive portion 711, the second conductive portion 712 and the third conductive portion 713 are electrically connected with each other. The first conductive portion 711 is in a same layer as the source electrode 234 or the drain electrode 235. The second conductive portion 712 is in a same layer as the connection electrode 260. The third conductive portion 713 is in a same layer as the first electrode 221. A material of the first conductive portion 711 is the same as a material of the source electrode 234 or the drain electrode 235, and the first conductive portion 711, the source electrode and the drain electrode are formed by a same patterning process. A material of the second conductive portion 712 is the same as a material of the connection electrode 260, and the second conductive portion 712 and the connection electrode are formed by a same patterning process. A material of the third conductive portion 713 is the same as a material of the first electrode 221, and the third conductive portion 713 and the first electrode 221 are formed by a same patterning process. As shown in FIG. 10, the third conductive portion 713 is spaced apart from the first electrode 221, and the third conductive portion 713 is electrically connected to the second electrode 222.

In some embodiments, as shown in FIG. 10, the display substrate may further comprise a first dam 810. The first dam 810 may comprise a portion 811 in a same layer as the second planarization layer 522 and a portion 812 in a same layer as the pixel defining layer 523. The display substrate may further comprise a second dam 820. The second dam 820 may comprise a portion 821 in a same layer as the second planarization layer 522, a portion 822 in a same layer as the pixel defining layer 523, and a portion 823 in a same layer as the spacer layer 630.

In addition, as shown in FIG. 10, in each touch electrode line 410, the first wire 541 is electrically connected to the second wire 542 through a first conductive via hole 961, which can reduce the resistance of the touch electrode line 410. The first conductive via hole 961 comprises a via hole passing through the second insulating layer 536 and a conductive material layer within the via hole. The first wire 541 is in a same layer as the conductive layer 910 and the fixed signal wire 930, so that the first wire, the conductive layer and the fixed signal wire can be formed by a same patterning process, thereby facilitating the manufacture of the display substrate.

Heretofore, the display substrate according to some embodiments of the present disclosure has been described in detail.

In some embodiments of the present disclosure, a display device is further provided. The display device may comprise the display substrate (such as the display substrate shown in FIG. 1) as described above. For example, the display device may be any product or component having a display function, such as a display panel, a mobile phone, a tablet computer, a television, a display, a notebook computer, a digital photo bezel, a navigator, or the like.

Figure 11:
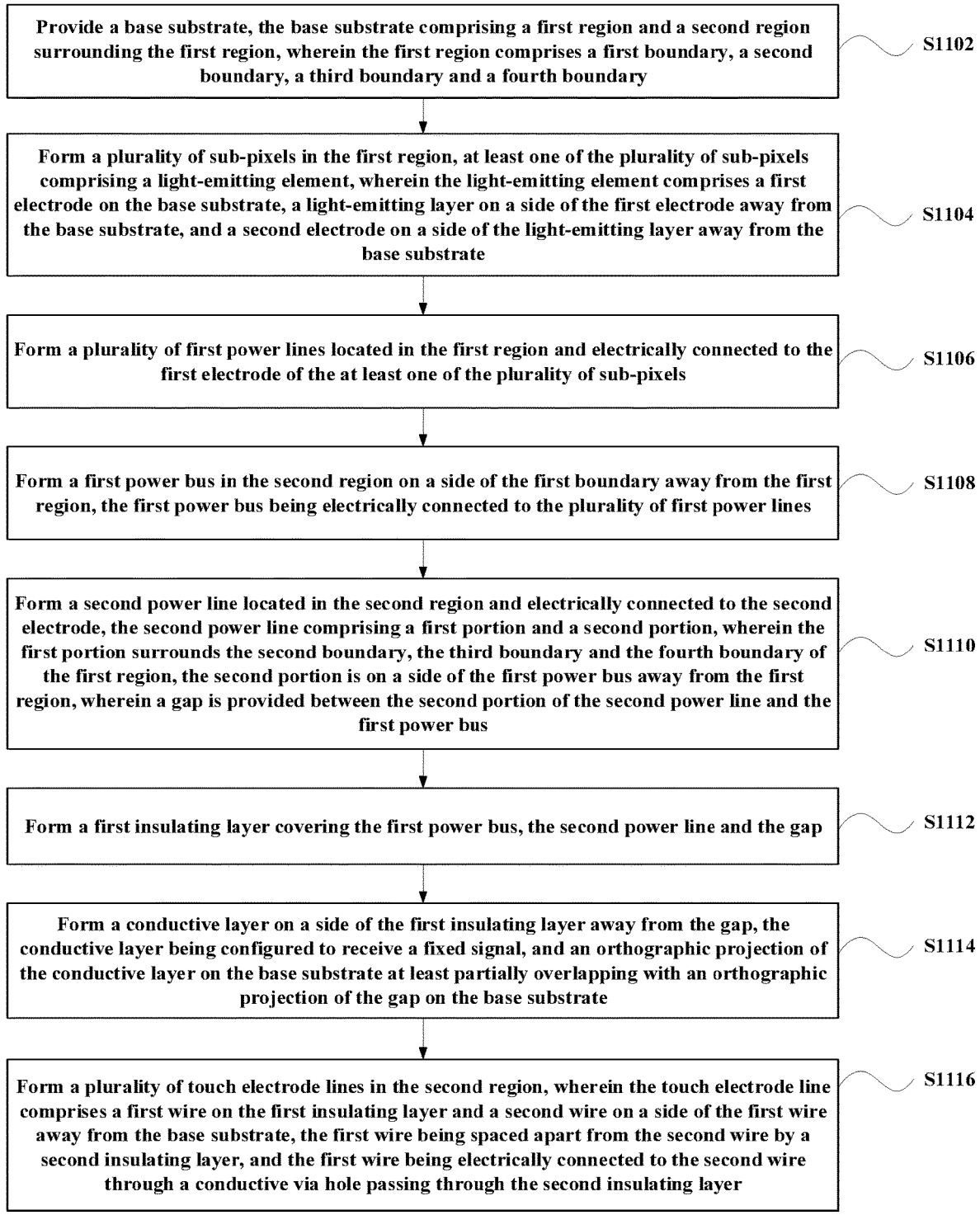
FIG. 11 is a flowchart showing a manufacturing method for a display substrate according to an embodiment of the present disclosure.

FIG. 11 is a flowchart showing a manufacturing method for a display substrate according to an embodiment of the present disclosure. As shown in FIG. 11, the manufacturing method comprises steps S1102 to S1116.

In step S1102, abase substrate is provided, the base substrate comprising a first region and a second region surrounding the first region, the first region comprising a first boundary, a second boundary, a third boundary and a fourth boundary.

In step S1104, a plurality of sub-pixels are formed in the first region, at least one of the plurality of sub-pixels comprising a light-emitting element, wherein the light-emitting element comprises a first electrode on the base substrate, a light-emitting layer on a side of the first electrode away from the base substrate, and a second electrode on a side of the light-emitting layer away from the base substrate.

In step S1106, a plurality of first power lines are formed in the first region, the plurality of first power lines being electrically connected to the first electrode of the at least one of the plurality of sub-pixels.

In step S1108, a first power bus is formed in the second region on a side of the first boundary away from the first region, the first power bus being electrically connected to the plurality of first power lines.

In step S1110, a second power line is formed in the second region, the second power line being electrically connected to the second electrode, and the second power line comprising a first portion and a second portion, wherein the first portion surrounds the second boundary, the third boundary and the fourth boundary of the first region, the second portion is on a side of the first power bus away from the first region, wherein a gap is provided between the second portion of the second power line and the first power bus.

In step S1112, a first insulating layer covering the first power bus, the second power line and the gap is formed.

In step S1114, a conductive layer is formed on a side of the first insulating layer away from the gap, the conductive layer being configured to receive a fixed signal (for example, a ground signal), and an orthographic projection of the conductive layer on the base substrate at least partially overlapping with an orthographic projection of the gap on the base substrate.

In step S1116, a plurality of touch electrode lines are formed in the second region, the touch electrode line comprising a first wire on the first insulating layer and a second wire on a side of the first wire away from the base substrate, the first wire being spaced apart from the second wire by a second insulating layer, and the first wire being electrically connected to the second wire through a conductive via hole passing through the second insulating layer. The first wire is in a same layer as the conductive layer and is isolated from the conductive layer. The first wire and the conductive layer are formed by a same patterning process. An orthographic projection of the second wire on the base substrate at least partially overlaps with the orthographic projection of the conductive layer on the base substrate.

Heretofore, a manufacturing method for a display substrate according to an embodiment of the present disclosure is provided. In the manufacturing method, the formed conductive layer can play a signal shielding function, which can reduce signal interference between signal lines above and below the gap, thereby improving the display effect of the display substrate. In addition, by forming the first wire and the conductive layer in a same patterning process, the manufacture of the display substrate can be facilitated.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display substrate, comprising:
a base substrate comprising a first region and a second region surrounding the first region, wherein the first region comprises a first boundary, a second boundary, a third boundary and a fourth boundary;
a plurality of sub-pixels in the first region, at least one of the plurality of sub-pixels comprising a light-emitting element, wherein the light-emitting element comprises a first electrode on the base substrate, a light-emitting layer on a side of the first electrode away from the base substrate, and a second electrode on a side of the light-emitting layer away from the base substrate;
a plurality of first power lines located in the first region and electrically connected to the first electrode of the at least one of the plurality of sub-pixels;
a first power bus in the second region on a side of the first boundary away from the first region, the first power bus being electrically connected to the plurality of first power lines;
a second power line located in the second region and electrically connected to the second electrode, the second power line comprising a first portion and a second portion, wherein the first portion surrounds the second boundary, the third boundary and the fourth boundary of the first region, the second portion is on a side of the first power bus away from the first region, wherein a gap is provided between the second portion of the second power line and the first power bus;
a first insulating layer covering the first power bus, the second power line and the gap;
a conductive layer on a side of the first insulating layer away from the gap, the conductive layer being configured to receive a fixed signal, and an orthographic projection of the conductive layer on the base substrate at least partially overlapping with an orthographic projection of the gap on the base substrate; and
a plurality of touch electrode lines in the second region, wherein each of the plurality of touch electrode lines comprises a first wire on the first insulating layer and a second wire on a side of the first wire away from the base substrate, the first wire being spaced apart from the second wire by a second insulating layer, and the first wire being electrically connected to the second wire through a conductive via hole passing through the second insulating layer, wherein the first wire is in a same layer as the conductive layer and is isolated from the conductive layer, and an orthographic projection of the second wire on the base substrate at least partially overlaps with the orthographic projection of the conductive layer on the base substrate.

2. The display substrate according to claim 1, wherein a material of the conductive layer is the same as a material of the first wire.

3. The display substrate according to claim 1, wherein the plurality of touch electrode lines comprise a plurality of first touch electrode lines and a plurality of second touch electrode lines, the plurality of first touch electrode lines surrounding the second boundary, the third boundary and a portion of the first boundary, the plurality of second touch electrode lines surrounding the fourth boundary and another portion of the first boundary.

4. The display substrate according to claim 3, wherein each of the plurality of first touch electrode lines is a transmitting signal line, and each of the plurality of second touch electrode lines is a receiving signal line.

5. The display substrate according to claim 3, further comprising:
a first touch electrode block and a second touch electrode block in the first region, wherein the first touch electrode block is electrically connected to a first touch electrode line, and the second touch electrode block is electrically connected to a second touch electrode line, wherein the first touch electrode block and the second touch electrode block are in a same layer as the second wire, or the first touch electrode block and the second touch electrode block are in a same layer as the first wire.

6. The display substrate according to claim 1, further comprising:
a flexible circuit board electrically connected to the conductive layer, the flexible circuit board being configured to provide the fixed signal to the conductive layer.

7. The display substrate according to claim 6, further comprising:
a bending region between the conductive layer and the flexible circuit board, wherein the conductive layer is connected to the flexible circuit board via a fixed signal line passing through the bending region.

8. The display substrate according to claim 7, wherein the conductive layer is in a same layer as the fixed signal line, and a material of the conductive layer is the same as a material of the fixed signal line.

9. The display substrate according to claim 1, wherein the fixed signal is a ground signal.

10. The display substrate according to claim 1, wherein the orthographic projection of the gap on the base substrate is inside the orthographic projection of the conductive layer on the base substrate.

11. The display substrate according to claim 1, wherein:
a width of the gap extending in a direction perpendicular to the first boundary ranges from 40 microns to 60 microns; and
a width of the conductive layer extending in the direction perpendicular to the first boundary ranges from 50 microns to 70 microns.

12. The display substrate according to claim 1, wherein:
the second portion comprises a first sub-portion and a second sub-portion, wherein the first sub-portion is spaced apart from and disposed opposite to the second sub-portion, the first sub-portion being close to the second boundary, and the second sub-portion being close to the fourth boundary; and
a first gap is provided between the first sub-portion and the first power bus, and a second gap is provided between the second sub-portion and the first power bus, wherein an orthographic projection of at least one of the first gap or the second gap on the base substrate at least partially overlaps with the orthographic projection of the conductive layer on the base substrate.

13. The display substrate according to claim 1, wherein:
the first power bus is configured to receive a first voltage signal; and
the second power line is configured to receive a second voltage signal;
wherein the first voltage signal is greater than the second voltage signal.

14. The display substrate according to claim 1, wherein the first insulating layer comprises:
a planarization layer covering the first power bus and the second power line;
a pixel defining layer on the planarization layer;
an encapsulation layer on a side of the pixel defining layer away from the planarization layer; and
a barrier layer on a side of the encapsulation layer away from the pixel defining layer.

15. The display substrate according to claim 1, further comprising:
a third insulating layer covering the base substrate, wherein the first power bus and the second power line are on a side of the third insulating layer away from the base substrate.

16. The display substrate according to claim 15, further comprising:
a plurality of first signal lines and a plurality of second signal lines embedded in the third insulating layer, wherein orthographic projections of the plurality of first signal lines on the base substrate are alternately arranged with orthographic projections of the plurality of second signal lines on the base substrate.

17. A display device, comprising: the display substrate according to claim 1.

18. A manufacturing method for a display substrate, comprising:
providing a base substrate, the base substrate comprising a first region and a second region surrounding the first region, wherein the first region comprises a first boundary, a second boundary, a third boundary and a fourth boundary;

forming a plurality of sub-pixels in the first region, at least one of the plurality of sub-pixels comprising a light-emitting element, wherein the light-emitting element comprises a first electrode on the base substrate, a light-emitting layer on a side of the first electrode away from the base substrate, and a second electrode on a side of the light-emitting layer away from the base substrate;

forming a plurality of first power lines located in the first region and electrically connected to the first electrode of the at least one of the plurality of sub-pixels;

forming a first power bus in the second region on a side of the first boundary away from the first region, the first power bus being electrically connected to the plurality of first power lines;

forming a second power line located in the second region and electrically connected to the second electrode, the second power line comprising a first portion and a second portion, wherein the first portion surrounds the second boundary, the third boundary and the fourth boundary of the first region, the second portion is on a side of the first power bus away from the first region, wherein a gap is provided between the second portion of the second power line and the first power bus;

forming a first insulating layer covering the first power bus, the second power line and the gap;

forming a conductive layer on a side of the first insulating layer away from the gap, the conductive layer being configured to receive a fixed signal, and an orthographic projection of the conductive layer on the base substrate at least partially overlapping with an orthographic projection of the gap on the base substrate; and forming a plurality of touch electrode lines in the second region, wherein each of the plurality of touch electrode lines comprises a first wire on the first insulating layer and a second wire on a side of the first wire away from the base substrate, the first wire being spaced apart from the second wire by a second insulating layer, and the first wire being electrically connected to the second wire through a conductive via hole passing through the second insulating layer, wherein the first wire is in a same layer as the conductive layer and is isolated from the conductive layer, the first wire and the conductive layer are formed by a same patterning process, and an orthographic projection of the second wire on the base substrate at least partially overlaps with the orthographic projection of the conductive layer on the base substrate.

* * * * *